United States Patent
Lin et al.

(10) Patent No.: US 6,737,345 B1
(45) Date of Patent: May 18, 2004

(54) SCHEME TO DEFINE LASER FUSE IN DUAL DAMASCENE CU PROCESS

(75) Inventors: Kang-Cheng Lin, Yunghe (TW); Chin-Chiu Hsia, Taipei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 85 days.

(21) Appl. No.: 10/238,290

(22) Filed: Sep. 10, 2002

(51) Int. Cl.[7] .............................................. H01L 21/44
(52) U.S. Cl. ...................... 438/601; 438/612; 438/623; 438/620; 438/622; 438/638; 438/132; 438/215; 438/281; 257/529; 257/530
(58) Field of Search ................................ 438/601, 612, 438/623, 620, 622, 638, 132, 215, 281; 257/529, 530

(56) References Cited

U.S. PATENT DOCUMENTS

| | | | | |
|---|---|---|---|---|
| 5,321,300 A | * | 6/1994 | Usuda et al. ................ 257/529 |
| 5,759,906 A | * | 6/1998 | Lou ............................ 438/623 |
| 5,795,819 A | | 8/1998 | Motsiff et al. .............. 438/618 |
| 6,033,939 A | | 3/2000 | Agarwala et al. ........... 438/132 |
| 6,111,301 A | * | 8/2000 | Stamper ...................... 257/529 |
| 6,114,231 A | * | 9/2000 | Chen et al. ................. 438/612 |
| 6,180,503 B1 | | 1/2001 | Tzeng et al. ................ 438/601 |
| 6,235,557 B1 | | 5/2001 | Manley ....................... 438/132 |
| 6,559,042 B2 | * | 5/2003 | Barth et al. ................. 438/601 |
| 6,645,781 B1 | * | 11/2003 | Jiang et al. ................... 438/14 |
| 6,667,533 B2 | * | 12/2003 | Daubenspeck et al. ..... 257/529 |
| 2003/0003703 A1 | * | 1/2003 | Barth et al. ................. 438/601 |
| 2003/0038339 A1 | * | 2/2003 | Mori .......................... 257/530 |

* cited by examiner

*Primary Examiner*—Matthew Smith
*Assistant Examiner*—V. Yevsikov
(74) *Attorney, Agent, or Firm*—George O. Saile; Stephen B. Ackerman

(57) ABSTRACT

A method of fabrication used for semiconductor integrated circuit devices to define a thin copper fuse at a top via opening, in a partial etch, dual damascene integration scheme, efficiently reducing top metal thickness in a fusible link, for the purpose of laser ablation. Some advantages of the method are: (a) avoids copper fuse contact to low dielectric material, which is subject to the thermal shock of laser ablation, (b) increases insulating material thickness over the fuse using better thickness control, and most importantly, (c) reduces the copper fuse thickness, for easy laser ablation of the copper fuse, and finally, (d) uses USG, undoped silicate glass to avoid direct contact with low dielectric constant materials.

38 Claims, 3 Drawing Sheets

SCHEME TO DEFINE LASER FUSE IN DUAL DAMASCENE CU PROCESS

BACKGROUND OF THE INVENTION (1) Field of the Invention

This invention relates to a method of fabrication used for semiconductor integrated circuit devices, and more specifically, to define a thin copper fuse at a top via opening, in a partially etched, dual damascene integration scheme, efficiently reducing top metal thickness in a fusible link, for the purpose of laser ablation.

(2) Description of Related Art

The related Prior Art background patents will now be described in this section.

U.S. Pat. No. 6,235,557 B1 entitled "Programmable Fuse and Method Thereof" granted May 22, 2001 to Manley, shows a copper fuse in a next to last metal interconnect layer. A programmable fuse implements redundancy in semiconductor devices and enables the repair of defective elements. A fuse is built in the second-to-the-last metal interconnect layer used in the circuit. An opening to expose the fuse is incorporated into an existing mask of the last metal interconnect layer, typically the pad mask. The passivation layer on top of the bond pads is opened to expose the bonding pads. At the same time, a residual oxide window is defined over the fuse. The residual oxide covering the fuse provides for a reliable and reproducible fuse.

U.S. Pat. No. 6,180,503 B1 entitled "Passivation Layer Etching Process for Memory Arrays With Fusible Links" granted Jan. 30, 2000 to Tzeng et al. teaches a copper laser fuse process. A method is described for progressively forming a fuse access openings in integrated circuits which are built with redundancy and use laser trimming to remove and insert circuit sections. The fuses are formed in a polysilicon layer and covered by one or more relatively thin insulative layers. An etch stop is patterned over the fuse in a higher level polysilicon layer or a first metallization layer. Additional insulative layers such as inter-metal dielectric layers are then formed over the etch stop. A first portion of the laser access window is then etched during the via etch for the top metallization level. A laser access window is formed over the fuses.

U.S. Pat. No. 6,033,939 entitled "Method for Providing Electrically Fusible Links In Copper Interconnect" granted Mar. 7, 2000 to Agarwala et al. discloses electrical fuses in copper interconnects with a dual damascene process. A method is provided for the fabrication of fuses within a semiconductor IC structure, which fuses are detectable by a laser pulse or a low voltage electrical pulse typically below 3.5 v to reroute the electrical circuitry of the structure to remove a faulty element. The fuses are formed on the surface of circuitry which is coplanar with a surrounding dielectric such as the circuitry formed by a damascene method. A preferred fuse material is silicon-chrome-oxygen and the preferred circuitry is copper.

U.S. Pat. No. 5,795,819 entitled "Integrated Pad and Fuse Structure For Planar Copper Metallurgy" granted Aug. 18, 1998 to Motsiff et al. shows a semiconductor interconnection consists of a corrosion resistant integrated fuse and a Controlled, Collapse, Chip Connection (C4) structure for the planar copper Back End of Line (BEOL). Non-copper fuse material is directly connected to copper wiring.

SUMMARY OF THE INVENTION

This invention relates to a method of fabrication used for semiconductor integrated circuit devices, and more specifically, to define a thin copper fuse at a top via opening, in a partially etched, dual damascene integration scheme, efficiently reducing top metal thickness in a fusible link, for the purpose of laser ablation.

As a background to the current invention, it remains a challenge in dual damascene processing to improve upon the Prior Art conventional methods for fabrication copper laser fuses, which traditionally locate the copper laser fuses in a wiring level, termed an N-2 metal layer, considerably below the surface of the semiconductor substrate. This requires that a very thick layer of dielectric material has to be etched without the benefit of an etch stop and the copper fuse is typically buried in a low dielectric constant material. The low dielectric constant material has poor thermal conductivity, a low glass transition temperature, and poor mechanical stress properties, and thus, tends to be prone to thermal shock, as a laser pulse ablates a copper fuse. However, to relocate laser fuses to an upper surface, top metal wiring level, is a problem since the top metal wiring level is always used for power line wiring, requiring thicker metal, and thus, increases the difficulty to cleanly ablate a thick copper fuse.

The method of the present invention overcomes the problems encountered by the Prior Art methods listed above, and some of the advantages of the present invention:

(a) avoids copper fuse contact to low dielectric material, which is subject to the thermal shock of laser ablation, (b) increases insulating material thickness over the fuse, using better thickness control, and most importantly, (c) reduces the copper fuse thickness, for easy laser ablation of the copper fuse, and finally, (d) uses USG, undoped silicate glass to avoid direct contact with low dielectric constant materials.

Basically, the dual damascene method of the present invention is as follows:

a) defining a via pattern with photoresist and a via photo-mask, for purpose of partially etching exposed via openings, and fully etching exposed fuse openings, which are close to the surface of the substrate b) partially etching the exposed insulator forming partially etched via openings and fully etched fuse openings, stopping on an etch stop layer c) defining a trench pattern with photoresist and a trench photo-mask, for purpose of etching exposed trench openings, partially etching trench/via openings, and completely covering fuse openings with protective photoresist d) fully etching the exposed insulator forming fully etched trench openings, completing a partial etch of the trench/via openings, while protecting fuse openings e) etching through a bottom liner or thin insulator layer to breakthrough that layer to make electrical contact to a lower metal wiring layer, before stripping the trench patterned photoresist f) depositing a diffusion barrier and copper seed layer in the trench openings, in the trench/via openings and in the laser via openings g) plating copper over the copper seed layer h) chemical mechanical polishing the excess material, excess copper and planarizing the surface, forming inlaid copper interconnects, contact vias and copper laser via fuses Thus, forming copper laser via fuses, which are fusible links, delectable by laser pulses, for the purpose of rerouting various components on an integrated circuit, the fuses being formed in a dual damascene trench/via process. Furthermore, openings are formed for a laser access window to the via fuses by defining openings in insulators over the via fuses. Through the laser access window, laser radiation enters through the access window for laser ablation of the delectable, copper laser via fuses, which are fusible links.

This invention has been summarized above and described with reference to the preferred embodiments. Some processing details have been omitted and are understood by those skilled in the art. More details of this invention are stated in the "DESCRIPTION OF THE PREFERRED EMBODIMENTS" section.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

This invention relates to a method of fabrication used for semiconductor integrated circuit devices, and more specifically, to define a thin copper fuse at a top via opening, in a partially etched dual damascene integration scheme, efficiently reducing top metal thickness in a fusible link, for the purpose of laser ablation.

Figure 1A:
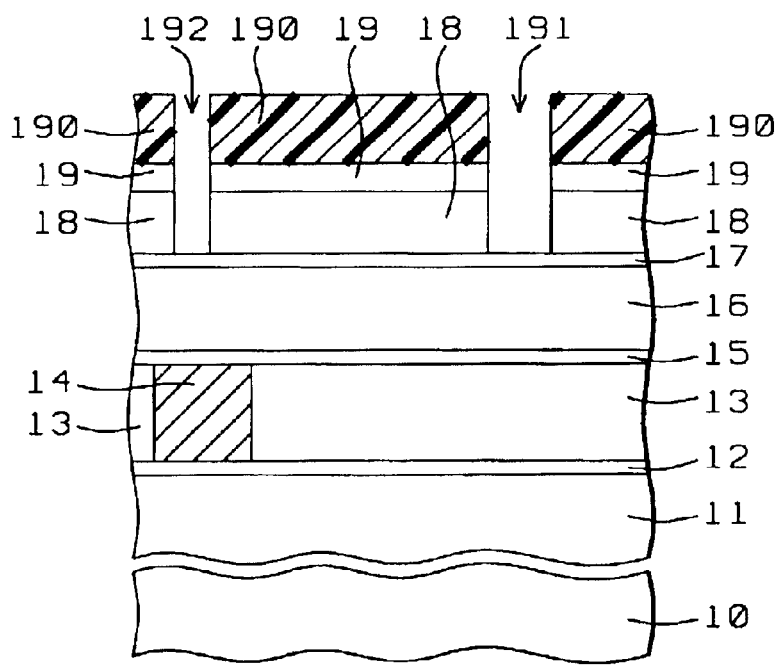
FIG. 1A through FIG. 1D, which in cross-sectional representation illustrate the process steps for forming a fuse, which is a fusible link in a dual damascene process, according to the embodiments of this invention.

With reference to FIG. 1A through FIG. 1D, which in cross-sectional representation illustrate the process steps for forming a fuse, which is a fusible link in a dual damascene process, according to the embodiments of this invention. More specifically with reference to FIG. 1A, which in cross-sectional representation illustrates the first process step in forming a laser via fuse. A via photo-mask is used to define an upper surface copper fuse and, at the same time, an upper surface level via opening. Details of the FIG. 1A sketch are the following: provided is a substrate 10, which is a semiconductor selected from the group consisting of Si, Ge, and SOI, silicon on insulator, containing semiconductor devices with integrated circuits therein. Provided is an IMD, intermetal dielectric 11, which is a first layer of USG, undoped silicate glass 13, that contains metal interconnect wiring and contact vias imbedded in the dielectric layer, and this wiring level is termed the "N-2 level". A first etch stop layer 12, is deposited over the intermetal dielectric 11. This first etch stop layer 12 is comprised of silicon nitride or silicon carbide, thickness approximately 30 nm. A second layer of USG, undoped silicate glass 13, is deposited over the etch stop layer 12, the USG thickness approximately 500 nm. This second layer of USG, undoped silicate glass 13, is patterned and etched to form openings, which in the next process step are filled with copper to form copper interconnect wiring 14. The copper is deposited in the opening in the undoped silicate glass 13 and interconnect wiring 14 forms an "N-1 level" wiring layer. This interconnect wiring 14 is formed by a damascene process with a chemical mechanical polish of any excess copper, planarizing the surface to form inlaid copper interconnect wiring 14 and contact vias. Next, a second etch stop layer 15, is deposited over the layer of USG, undoped silicate glass 13. This second etch stop layer 15 is comprised of silicon nitride or silicon carbide, thickness approximately 30 nm. A third layer of USG, undoped silicate glass 16, is deposited over the second etch stop layer 15, the USG thickness approximately 500 nm. This USG layer 16 separates the interconnect wiring 14 on the "N-1 level" wiring from the subsequent "N-level" wiring, to be formed in subsequent process steps. Next, a third etch stop layer 17, is deposited over the third layer of USG, undoped silicate glass 16. This third etch stop layer 17 is comprised of silicon nitride or silicon carbide, thickness approximately 30 nm. Next, a fourth layer of USG, undoped silicate glass 18, is deposited over the third etch stop layer 17, the USG thickness approximately 900 nm. A layer of silicon oxynitride 19 is deposited, thickness approximately 2000 Angstroms, over the fourth layer of USG 18, to be used in subsequent process steps as a "buffer layer" for chemical mechanical polish. Next, a layer of via photoresist 190 is formed over the silicon oxynitride layer 19. The layer of via photoresist 190 is exposed, developed and patterned using a via photo-mask to form via openings, opening 191 for subsequent laser via fuse formation, and opening 192 for subsequent trench/via formation to form interconnect wiring and contact vias, in a dual damascene process. The openings in the via photoresist, namely 191 and 192, allow the etching of the layer below a "partial etching step", namely the exposed silicon oxynitride 19 and the exposed USG 18, are to be etched. These layers 19 and 18 are now etched through to, and stopping on, the third etch stop layer 17. Thus, the fuse opening 191 and the trench/via opening 192 are formed, as shown in FIG. 1A. These openings 191 and 192 are the start of forming metal wiring on the "N-level".

Figure 1B:
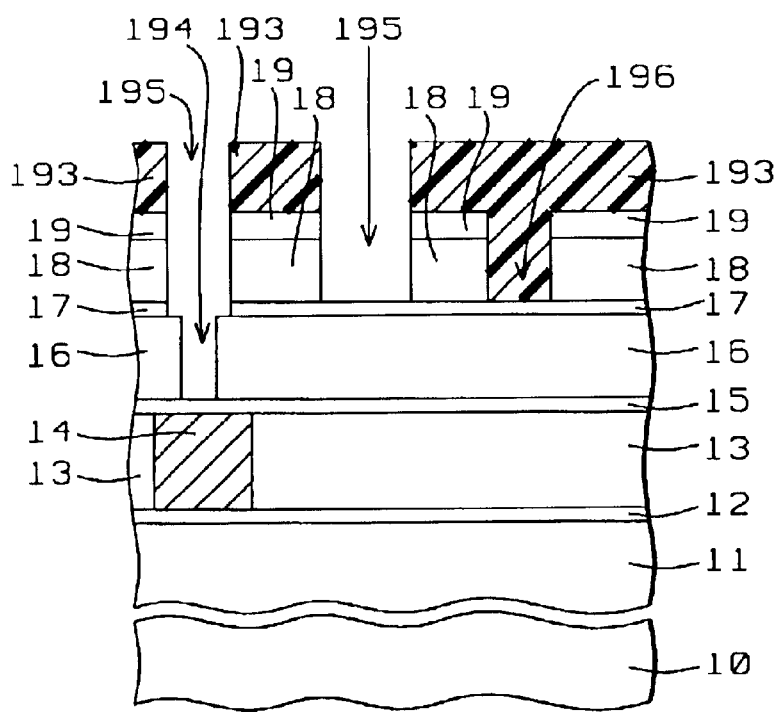

With reference to FIG. 1B, which in cross-sectional representation illustrates the process steps for forming a laser via fuse, and in this set of process steps, trench photoresist is patterned to allow further etching of a trench/via, partial etching of a trench, and the trench photoresist is used to protect the laser via fuse opening from being etched. The previous layer of via photoresist 190, shown in FIG. 1A, is stripped from the surface. A trench layer of photoresist 193 is patterned and formed, which is over the silicon oxynitride 19, and in the fuse opening 196 (arrow). Thus, the fuse opening 196 (arrow) is protected from etching by the trench photoresist. An etching step is now performed forming a trench opening 195 (arrow) and a via opening 194 (arrow) by stopping the etch on the second etch stop layer, the combination being a trench/via opening, and, at the same time, forming a partially etched trench opening 193 (arrow) by stopping the etch on the third etch stop layer 17.

Figure 1C:
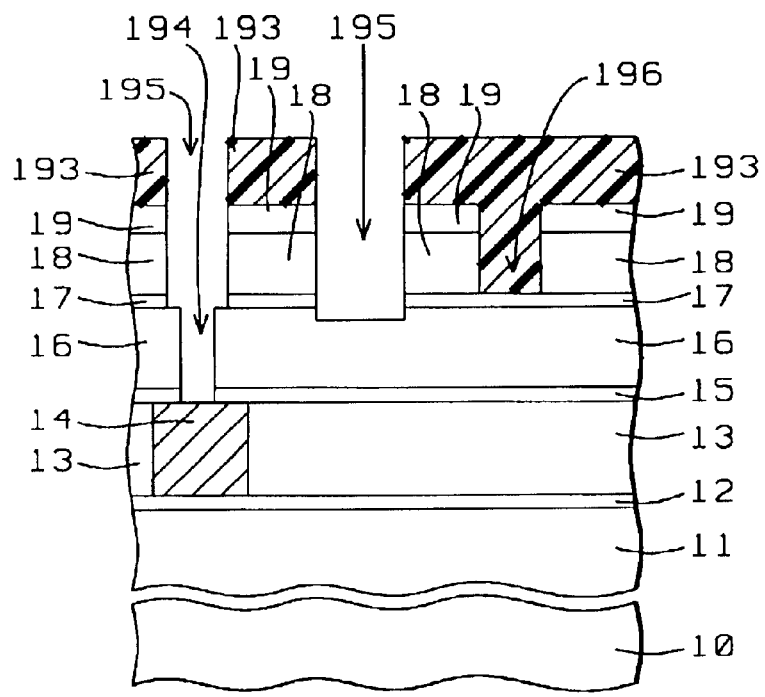

With reference to FIG. 1C, which in cross-sectional representation illustrates the process steps for forming a laser via fuse, and in this set of process steps, further etching of trench/via is performed, using the same trench photoresist 193 pattern, as was shown in FIG. 1B. The type of photoresist used throughout is comprised of top surface imaging photoresist, with an approximate thickness of 10,000 Angstroms, exposed using ultraviolet light of 248 nm wavelength. The second etch stop layer 15 is etched away in the exposed via 194 (arrow) to allow electrical contact to the copper interconnect 14. Furthermore, the trench opening 195 (arrow) is etched through to the exposed third etch stop layer 17, to form a complete trench opening 195 (arrow).

Figure 1D:
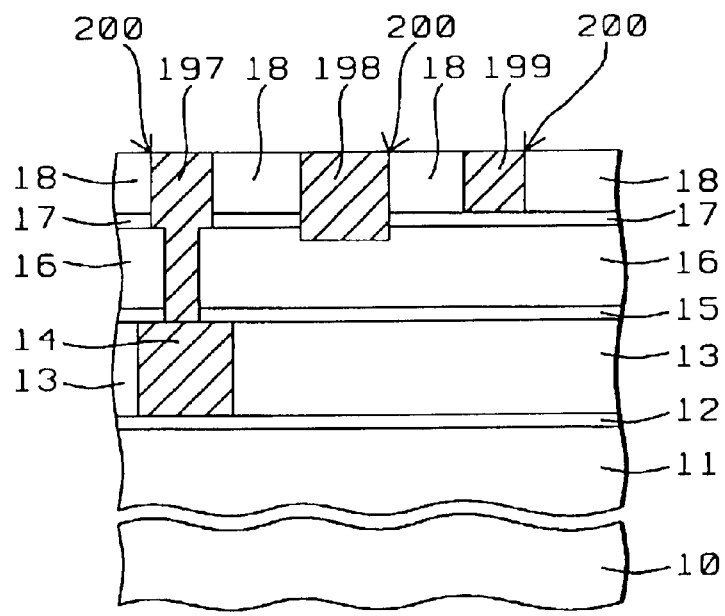

With reference to FIG. 1D, which in cross-sectional representation illustrates the final process steps for forming a laser via fuse, and in this set of process steps, note that the trench layer of photoresist 193, shown in FIG. 1C, is now stripped from the surface. Again, with reference to FIG. 1D, the trench photoresist has been removed from the surface leaving: (a) a trench/via opening 197, soon to be filled with plated copper, (b) a trench opening 198, soon to be filled with plated copper, (c) a laser via fuse opening 199, soon be filled with copper. Next, both a copper diffusion barrier layer and a copper seed layer are deposited over the layer of silicon oxynitride (19, in FIG. 1C) and in the trench/via 197, in the trench 198, and in the laser via fuse 199. The combination of very thin diffusion barrier and seed layer is designated 200 in FIG. 1D. These layers serve as a liner for the trench/via 197, the trench 198 and the laser via fuse 199. The thin diffusion barrier is selected from the group consisting of a layer of: TaN, or TiSiN deposited by sputtering and reactive sputtering, which is a physical vapor deposition, PVD, approximate thickness 200 Angstroms. The seed layer is comprised of a layer of copper deposited by sputtering, which is a physical vapor deposition, PVD, approximate thickness 1500 Angstroms. The next process step is the electrochemical copper plating of approximately 1.0 microns, over the copper seed layer forming a layer of excess copper over the surface. The excess copper is removed by chemical mechanical polish, with endpoint detection using IR reflectivity, which planarizes the surface and also removes from the surface: (a) the copper seed layer, (b) the diffusion barrier, (c) the silicon oxynitride. Thus, as shown in FIG. 1D, the following is formed (all on the "N-level" as previously outlined in FIG. 1A): (a) a copper laser via fuse 199, thickness approximately between 6,000 to 7,000 Angstroms, which is thinner than a metal line, making the laser fuse easier to laser ablate, (b) a trench 198 filled with copper forming a copper interconnect wiring line, thickness approximately 9,000 Angstroms, (c) a trench/via 197 filled with copper, trench thickness approximately 9,000 Angstroms, with connecting contact via to the copper interconnect wiring 14, on the "N-1 level".

Figure 2:
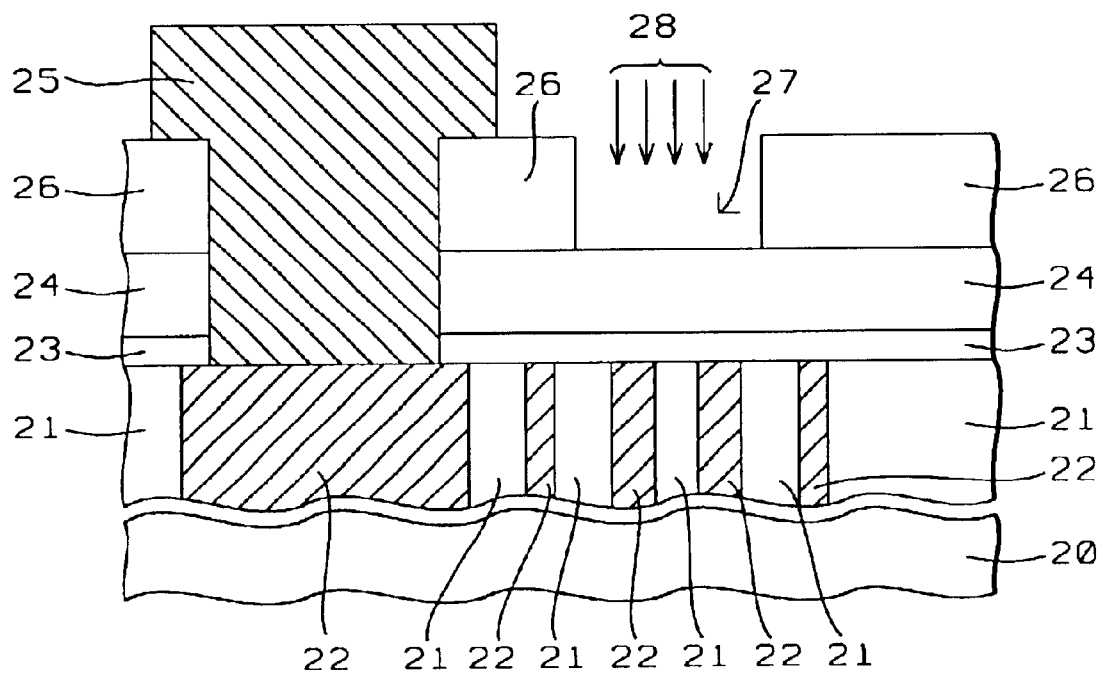
FIG. 2, which in cross-sectional representation illustrates the method of the present invention, wherein an access window is formed to a fuse, which is a fusible link on the "N-level", the N-level being a level of copper wiring.

With reference to FIG. 2, which in cross-sectional representation illustrates the method of the present invention, wherein a laser access window is formed to the laser via fuse (the fuse formation outlined in FIGS. 1A–D), which is a fusible link on the "N-level", the N-level being a level of copper wiring. The access window is formed close to the upper surface, for the purpose of laser ablation of the delectable copper fuses. The N-level 20, indicated abstractly in FIG. 2, is the level or layer of copper wiring that contains the copper laser via fuses, which are close to the surface and the dimensions of the fuses, which are fusible links, are: approximate width between 0.4 to 0.7 microns, approximate length 10 microns, and approximate thickness between 6,000 to 7,000 Angstroms. The N-level 20, indicated abstractly in FIG. 2, is sketched in detail in FIG. 1D, with the fuse 199, the interconnect wiring 198, and the trench/via interconnect and contact via 197. Again, with reference to FIG. 2, a first layer of USG 21, undoped silicate glass with a low dielectric constant is deposited over the N-level 20 copper wiring layer. The USG 21 is patterned and etched to form openings for subsequent copper fill. Copper wiring lines 22, thickness approximately 900 nm, are formed in the openings of the USG 21, forming a RDL, redistribution layer, which "fans out" the copper wiring and is formed over the N-level. A first layer of silicon nitride 23 is deposited over the copper wiring lines 22 and over the USG 21, with nitride thickness being approximately 70 nm. A second layer of USG 24, undoped silicate glass is deposited over the silicon nitride layer 23, the USG being approximately 500 nm thick. A second layer of silicon nitride 26, thickness approximately 700 nm, is deposited over the USG 24. Openings for the laser access window 27 are formed by patterning and etching openings in the layer of silicon nitride 26. Openings for subsequent aluminum bond pads are formed by patterning and etching openings in the following layers: the second layer of silicon nitride 26, the second layer of USG 24, and the first layer of silicon nitride 23.

Note, the subsequent selective removal of exposed regions of the USG layers, undoped silicate glass, which form intermetal dielectric layers, IMD, is by a single or multi-step etch comprised of a reactive ion etch, RIE, with an etch chemistry selected from the group consisting of, one or more gases from the following: oxygen, nitrogen, hydrogen, chlorine substituted hydrocarbons, forming gas mixtures of nitrogen and hydrogen gas, fluorine substituted hydrocarbons, boron trichloride, argon and helium, stopping on an etch-stop layer.

Finally, aluminum bond pads 25 are formed in the nitride, USG, nitride openings formed above, and the aluminum bond pads 25 are formed over some of the copper wiring lines 22, that are the redistribution layer. Some of the bond pads 25 make electrical contact to the wiring lines 22. The laser radiation or light 28 for the laser ablation of the copper fuse is depicted in FIG. 2, and is shown to be aligned with the access window 27. The laser wavelength used is 1,320 nm. Ablation is performed on the fusible links or fuses in the N-level 20 below, using a laser pulse. Certain fuses are selected based on improving circuit performance and reliability. Note, in the present invention, the laser via fuses are close to the surface for easy laser ablation. Thus, the laser radiation, of wavelength 1,320 nm, enters through the laser access window and using laser pulses, 0.3 milliJoules, pulse duration 20 milliseconds, ablation is performed on the delectable, copper via fuses, which are fusible links in the N-level close to the surface, to improve circuit performance and reliability.

For a fuse to be easily delectable by a laser pulse, the following material properties and geometry are key to blow or vaporize the fuse cleanly:

(a) the fusion energy of the fuse material should be low
(b) the cross-sectional area of the fuse should be small
(c) the density of the fuse material should be low In terms of insulating material for many of the IMD, intermetal dielectric layers, the insulating material is selected from the group consisting of the following insulators: USG, undoped silicate glass and low dielectric constant insulators, comprised of fluorine doped silicon dioxide, FSG, spin on glass, SOG, porous silicon oxide, porous silicon or oxycarbide, or combination of the above, with a thickness of approximately 900 nm.

While the invention has been particularly shown and described with reference to the preferred embodiments thereof, it will be understood by those skilled in the art that various changes in form and details may be made without departing from the spirit and scope of the invention.

What is claimed is:

1. A method for forming copper laser via fuses, which are fusible links, detectable by laser pulses, for the purpose of rerouting various components on an integrated circuit, the fuses being formed in a dual damascene trench/via process, the method comprising:

providing a semiconductor substrate containing semiconductor devices with integrated circuits therein;

forming, by a dual damascene method, a via pattern defining the size and shape of laser via fuse openings, and partial trench/via openings in an insulator;

forming, by a dual damascene method, a trench pattern, protecting the laser via fuse openings, while defining the trench and trench/via openings in an insulator;

forming copper conductors in said laser via fuse openings, said trench openings and said trench/via openings, forming interconnect wiring, contact vias and copper laser via fuses;

forming laser access windows to the copper laser via fuses for the purpose of access to the fuses for subsequent laser ablation.

2. The method of claim 1, wherein the semiconductor substrate is a semiconductor selected from the group consisting of Si, Ge, and SOI, silicon on insulator, containing semiconductor devices with integrated circuits therein.

3. The method of claim 1, wherein the insulator is an IMD, intermetal dielectric layer, selected from the group consisting of USG, undoped silicate glass and low dielectric constant insulators, comprised of fluorine doped silicon dioxide, FSG, spin on glass, SOG, porous silicon oxide, porous silicon or oxycarbide, or combination of the above, with a thickness of approximately 900 nm.

4. The method of claim 1, wherein the interconnect wiring, contact vias and copper laser via fuses; are formed using a TaN or TiSiN diffusion barrier layer, approximately 200 Angstroms thick, a copper seed layer approximately 1500 Angstroms thick, and plated copper of approximately 1 micron thick.

5. The method of claim 1, wherein the laser via fuses formed by an electrochemical copper plating process, and a via photo-mask process, are delectable fusible links, ablated by a laser pulse, with the dimensions of the fuses, and fuse properties, as follows: approximate width between 0.4 to 0.7 microns, approximate length 10 microns, and approximate thickness between 6,000 to 7,000 Angstroms, having a small cross-sectional area, low fusion energy, and low density, close to the surface, to easily blow, ablate, or vaporize the fuse cleanly without electrically conducting residues.

6. The method of claim 1, wherein the laser radiation, of wavelength 1,320 nm enters through the laser access window and using laser pulses, 0.3 milliJoules, pulse duration 20 milliseconds, ablation is performed on the delectable, copper via fuses, which are fusible links close to the surface, to improve circuit performance and reliability.

7. A method of forming a laser via fuse, which is a fusible link in a dual damascene process, the method comprising:

providing a semiconductor substrate;

providing a IMD, intermetal dielectric, which is a first layer of USG, undoped silicate glass, containing metal interconnect wiring and contact vias imbedded in the dielectric layer, termed the N-2 level;

depositing a first etch stop layer over the first layer of USG;

depositing a second layer of USG, undoped silicate glass over the first etch stop layer;

patterning and etching the second layer of USG, undoped silicate glass, is to form openings in the USG;

depositing copper in the USG openings and forming excess copper over the openings;

chemical mechanical polish to remove the excess copper and planarizing the surface to forming inlaid copper interconnect wiring and contact vias, termed the N-1 level;

depositing a second etch stop layer over the second layer of USG;

depositing a third layer of USG, undoped silicate glass over the second etch stop layer, separating the N-1 level wiring from subsequent N-level wiring;

depositing a third etch stop layer over the third layer of USG;

depositing a fourth layer of USG, undoped silicate glass over the third etch stop layer;

depositing a chemical mechanical polish stop layer over the fourth layer of USG;

forming a layer of via photoresist over the chemical mechanical polish stop layer;

exposing selected regions of the via photoresist layer to ultraviolet light using a via photo-mask forming exposed regions and unexposed regions, for subsequent laser via fuse formation, and subsequent partial trench/via formation;

removing the exposed selected regions of the via photoresist layer by developing and providing a patterned via photoresist mask for subsequent selective removal of exposed regions, for laser via fuse formation, and partial trench/via formation;

etching through the exposed chemical mechanical polish stop layer and the exposed fourth layer of USG, stopping on the third etch stop layer, forming a laser via fuse opening, and a partial trench/via opening;

stripping the layer of via photoresist from the surface;

forming a layer of trench photoresist over the chemical mechanical polish stop layer and in the laser via fuse opening, thus protecting the fuse opening;

exposing selected regions of the trench photoresist layer to ultraviolet light using a trench photo-mask forming exposed regions and unexposed regions, for trench and trench/via openings in the trench photoresist layer, while protecting the laser via fuse opening;

removing the exposed selected regions of the trench photoresist layer by developing and providing a patterned trench photoresist mask for subsequent selective removal of exposed regions, for trench and trench/via openings in the trench photoresist layer, while protecting the laser via fuse opening;

etching through the exposed chemical mechanical polish stop layer and the exposed fourth layer of USG, stopping on the third etch stop layer, and at the same time, etching through the exposed third etch stop layer and the exposed third layer of USG, stopping on the second etch stop layer;

etching further removing the exposed second etch stop layer and the exposed third etch stop layer, while partially etching the exposed third layer of USG, thus forming both trench/via openings, and trench openings;

stripping the layer of trench photoresist from the surface, leaving in place trench/via openings, trench openings, and laser via fuse openings;

depositing a diffusion barrier and copper seed layer over the chemical mechanical polish stop layer and in the trench/vias, in the trenches, and in the laser via fuse openings;

plating copper by electrochemical copper plating over the copper seed layer and in the trench/vias, in the trenches, and in the laser via fuse openings, forming a layer of excess copper over the surface;

chemical mechanical polishing the excess copper, planarizing the surface and removing from the surface the copper seed layer, the diffusion barrier, and the chemical mechanical polish stop layer or buffer layer, thus forming an N-level wiring layer comprised of inlaid copper laser via fuses, copper interconnect wiring lines, and trench/via connecting contact vias to the N-1 level wiring below.

8. The method of claim 7, wherein the semiconductor substrate is a semiconductor selected from the group consisting of Si, Ge, and SOI, silicon on insulator, containing semiconductor devices with integrated circuits therein.

9. The method of claim 7, wherein the IMD, intermetal dielectric layer is selected from the group consisting of USG, undoped silicate glass and low dielectric constant insulators, comprised of fluorine doped silicon dioxide, FSG, spin on glass, SOG, porous silicon oxide, porous silicon or oxycarbide, or combination of the above, with a thickness of approximately 900 nm.

10. The method of claim 7, wherein the etch-stop layers are comprised of silicon nitride or silicon carbide with a thickness of approximately 30 nm and are used as etch stops in the selective etch for trench, fuse and via openings, used in forming subsequent interconnect wiring lines, fuses and contact vias.

11. The method of claim 7, wherein the chemical mechanical polish stop layer is comprised of a layer of silicon oxynitride deposited over a layer of USG, undoped silicate glass and is used in subsequent process steps as a "buffer layer" for chemical mechanical polish, with the buffer layer thickness of approximately 2000 Angstroms, deposited by chemical vapor deposition, CVD.

12. The method of claim 7, wherein the diffusion barrier is selected from the group consisting of a layer of: TaN, or TiSiN deposited by sputtering and reactive sputtering, which is a physical vapor deposition, PVD approximate thickness 200 Angstroms.

13. The method of claim 7, wherein the seed layer is comprised of a layer of copper deposited by sputtering, which is a physical vapor deposition, PVD, approximate thickness 1500 Angstroms.

14. The method of claim 7, wherein the plated copper by electrochemical copper plating, ECD, that is plated over the over the copper seed layer and in the trench/vias, in the trenches, and in the laser via fuse openings, is plated with an approximate thickness of 1.0 microns.

15. The method of claim 7, wherein the copper laser via fuses deposited by electrochemical copper plating, ECD, and formed with a via photo-mask process, are delectable fusible links, ablated by a laser pulse, with the dimensions of the fuses, and fuse properties, as follows: approximate width between 0.4 to 0.7 microns, approximate length 10 microns, and approximate thickness between 6,000 to 7,000 Angstroms, having a small cross-sectional area, low fusion energy, and low density, close to the surface, to easily blow, ablate, or vaporize the fuse cleanly without electrically conducting residues.

16. The method of claim 7, whereby subsequent selective removal of exposed regions of the USG layers, undoped silicate glass, which form intermetal dielectric layers, IMD, is by a single or multi-step etch comprised of a reactive ion etch, RIE, with an etch chemistry selected from the group consisting of, one or more gases from the following: oxygen, nitrogen, hydrogen, chlorine substituted hydrocarbons, forming gas mixtures of nitrogen and hydrogen gas, fluorine substituted hydrocarbons, boron trichloride, argon and helium, stopping on an etch-stop layer.

17. The method of claim 7, whereby the excess copper, the diffusion barrier and the copper seed layer are removed from the surface and planarized by chemical mechanical polish, stopping on a chemical mechanical polish buffer layer or stop layer, with endpoint detection using IR reflectivity.

18. The method of claim 7, wherein the photoresist is comprised of top surface imaging photoresist, with an approximate thickness of 10,000 Angstroms and is exposed using ultraviolet light of 248 nm wavelength.

19. A method of forming a laser access window close to the upper surface, for the purpose of laser ablation of delectable laser via fuses, which are fusible links on N-level copper wiring formed by a dual damascene process, the method comprising:

providing a layer of copper wiring, termed N-level copper wiring, that contains copper laser via fuses, which are close to the surface forming fusible links;

depositing a first layer of USG, undoped silicate glass with a low dielectric constant over the N-level copper wiring layer;

patterning and etching the first layer of USG to forming openings for subsequent copper fill;

forming copper wiring lines, which form a redistribution layer, in the openings of the USG, over the N-level copper wiring layer;

depositing a first layer of silicon nitride over the copper wiring lines and over the first layer of USG;

depositing a second layer of USG, undoped silicate glass over the first layer silicon nitride;

depositing a second layer of silicon nitride over the over the second layer of USG;

forming openings for a laser access window by patterning and etching openings in the second layer of silicon nitride;

forming openings for subsequent aluminum bond pads by patterning and etching openings in the following layers: the second layer of silicon nitride, the second layer of USG, and the first layer of silicon nitride;

forming aluminum bond pads in the nitride, USG, nitride openings formed above, and the aluminum bond pads are formed over and make electrical contact to some of the copper wiring lines, that make up the redistribution layer;

thus, through the laser access window formed above, which is close to the surface, laser radiation enters through the access window for laser ablation of the delectable, copper laser via fuses, which are fusible links on the N-Level wiring.

20. The method of claim 19, wherein the copper laser via fuses are deposited by electrochemical copper plating, ECD, and formed with a via photo-mask process, are delectable fusible links, ablated by a laser pulse, with the dimensions of the fuses, and fuse properties, as follows: approximate width between 0.4 to 0.7 microns, approximate length 10 microns, and approximate thickness between 6,000 to 7,000 Angstroms, having a small cross-sectional area, low fusion energy, and low density, close to the surface, to easily blow, ablate, or vaporize the fuse cleanly without electrically conducting residues.

21. The method of claim 19, wherein the layers of USG, form intermetal dielectric layers, and are selected from the group consisting of USG, undoped silicate glass and low dielectric constant insulators, comprised of fluorine doped silicon dioxide, FSG, spin on glass, SOG, porous silicon oxide, porous silicon or oxycarbide, or combination of the above, with a thickness of approximately 900 nm.

22. The method of claim 19, wherein the silicon nitride are etch-stop layers, and for patterning a laser access window, comprised of silicon nitride with a thickness of approximately 70 nm and 700 nm, respectively.

23. The method of claim 19, whereby the aluminum bond pads formed in the nitride, USG, nitride openings, and the aluminum bond pads are formed over and make electrical contact to some of the copper wiring lines, that make up the redistribution layer.

24. The method of claim 19, wherein the laser radiation, of wavelength 1,320 nm enters through the laser access window and using laser pulses, 0.3 milliJoules, pulse duration 20 milliseconds, ablation is performed on the delectable, copper via fuses, which are fusible links in the N-level close to the surface, to improve circuit performance and reliability.

25. A method of forming, close to the upper surface, both a laser via fuse, which is a fusible link in a dual damascene trench/via process, and a laser access window, for the purpose of laser ablation of delectable laser via fuses, the method comprising:

providing a semiconductor substrate;

providing a IMD, intermetal dielectric, which is a first layer of USG, undoped silicate glass, containing metal interconnect wiring and contact vias imbedded in the dielectric layer, termed the N-2 level;

depositing a first etch stop layer over the first layer of USG;

depositing a second layer of USG, undoped silicate glass over the first etch stop layer;

patterning and etching the second layer of USG, undoped silicate glass, is to form openings in the USG;

depositing copper in the USG openings and forming excess copper over the openings;

chemical mechanical polish to remove the excess copper and planarizing the surface to forming inlaid copper interconnect wiring and contact vias, termed the N-1 level;

depositing a second etch stop layer over the second layer of USG;

depositing a third layer of USG, undoped silicate glass over the second etch stop layer, separating the N-1 level wiring from subsequent N-level wiring;

depositing a third etch stop layer over the third layer of USG;

depositing a fourth layer of USG, undoped silicate glass over the third etch stop layer;

depositing a chemical mechanical polish stop layer over the fourth layer of USG;

forming a layer of via photoresist over the chemical mechanical polish stop layer;

exposing selected regions of the via photoresist layer to ultraviolet light using a via photo-mask forming exposed regions and unexposed regions, for subsequent laser via fuse formation, and subsequent partial trench/via formation;

removing the exposed selected regions of the via photoresist layer by developing and providing a patterned via photoresist mask for subsequent selective removal of exposed regions, for laser via fuse formation, and partial trench/via formation;

etching through the exposed chemical mechanical polish stop layer and the exposed fourth layer of USG, stopping on the third etch stop layer, forming a laser via fuse opening, and a partial trench/via opening;

stripping the layer of via photoresist from the surface;

forming a layer of trench photoresist over the chemical mechanical polish stop layer, or buffer layer, and in the laser via fuse opening, thus protecting the fuse opening;

exposing selected regions of the trench photoresist layer to ultraviolet light using a trench photo-mask forming exposed regions and unexposed regions, for trench and trench/via openings in the trench photoresist layer, while protecting the laser via fuse opening;

removing the exposed selected regions of the trench photoresist layer by developing and providing a patterned trench photoresist mask for subsequent selective removal of exposed regions, for trench and trench/via openings in the trench photoresist layer, while protecting the laser via fuse opening;

etching through the exposed chemical mechanical polish stop layer and the exposed fourth layer of USG, stopping on the third etch stop layer, and at the same time, etching through the exposed third etch stop layer and the exposed third layer of USG, stopping on the second etch stop layer;

etching further removing the exposed second etch stop layer and the exposed third etch stop layer, while partially etching the exposed third layer of USG, thus forming both trench/via openings, and trench openings;

stripping the layer of trench photoresist from the surface, leaving in place trench/via openings, trench openings, and laser via fuse openings;

depositing a diffusion barrier and copper seed layer over the chemical mechanical polish stop layer and in the trench/vias, in the trenches, and in the laser via fuse openings;

plating copper by electrochemical copper plating over the copper seed layer and in the trench/vias, in the trenches, and in the laser via fuse openings, forming a layer of excess copper over the surface;

chemical mechanical polishing the excess copper, planarizing the surface and removing from the surface the copper seed layer, the diffusion barrier, and the chemical mechanical polish stop layer, forming an N-level wiring layer comprised of inlaid: copper laser via fuses, close to the surface forming fusible links, copper interconnect wiring lines, and trench/via connecting contact vias to the N-1 level wiring below;

depositing a first layer of USG, undoped silicate glass with a low dielectric constant over the N-level copper wiring layer;

patterning and etching the first layer of USG to forming openings for subsequent copper fill;

forming copper wiring lines, which form a redistribution layer, in the openings of the USG, over the N-level copper wiring layer;

depositing a first layer of silicon nitride over the copper wiring lines and over the first layer of USG;

depositing a second layer of USG, undoped silicate glass over the first layer silicon nitride;

depositing a second layer of silicon nitride over the over the second layer of USG;

forming openings for a laser access window by patterning and etching openings in the second layer of silicon nitride;

forming openings for subsequent aluminum bond pads by patterning and etching openings in the following layers: the second layer of silicon nitride, the second layer of USG, and the first layer of silicon nitride;

forming aluminum bond pads in the nitride, USG, nitride openings formed above, and the aluminum bond pads are formed over and make electrical contact to some of the copper wiring lines, that make up the redistribution layer;

thus, through the laser access window formed above, which is close to the surface, laser radiation enters through the access window for laser ablation of the delectable, copper laser via fuses, which are fusible links on the N-Level wiring.

26. The method of claim 25, wherein the semiconductor substrate is a semiconductor selected from the group consisting of Si, Ge, and SOI, silicon on insulator, containing semiconductor devices with integrated circuits therein.

27. The method of claim 25, wherein the IMD, intermetal dielectric layer is selected from the group consisting of USG, undoped silicate glass and low dielectric constant insulators, comprised of fluorine doped silicon dioxide, FSG, spin on glass, SOG, porous silicon oxide, porous silicon or oxycarbide, or combination of the above, with a thickness of approximately 900 nm.

28. The method of claim 25, wherein the etch-stop layers are comprised of silicon nitride or silicon carbide with a thickness of approximately 30 nm and are used as etch stops in the selective etch for trench, fuse and via openings, used in forming subsequent interconnect wiring lines, fuses and contact vias.

29. The method of claim 25, wherein the chemical mechanical polish stop layer is comprised of a layer of silicon oxynitride deposited over a layer of USG, undoped silicate glass and is used in subsequent process steps as a "buffer layer" for chemical mechanical polish, with the buffer layer thickness of approximately 2000 Angstroms, deposited by chemical vapor deposition, CVD.

30. The method of claim 25, wherein the diffusion barrier is selected from the group consisting of a layer of: TaN or TiSiN deposited by sputtering and reactive sputtering, which is a physical vapor deposition, PVD, approximate thickness 200 Angstroms.

31. The method of claim 25, wherein the seed layer is comprised of a layer of copper deposited by sputtering, which is a physical vapor deposition, PVD, approximate thickness 1500 Angstroms.

32. The method of claim 25, wherein the plated copper by electrochemical copper plating, ECD, that is plated over the over the copper seed layer and in the trench/vias, in the trenches, and in the laser via fuse openings, is plated with an approximate thickness of 1.0 microns.

33. The method of claim 25, wherein the copper laser via fuses deposited by electrochemical copper plating, ECD, and formed with a via photo-mask process, are delectable fusible links, ablated by a laser pulse, with the dimensions of the fuses, and fuse properties, as follows: approximate width between 0.4 to 0.7 microns, approximate length 10 microns, and approximate thickness between 6,000 to 7,000 Angstroms, having a small cross-sectional area, low fusion energy, and low density, close to the surface, to easily blow, ablate, or vaporize the fuse cleanly without electrically conducting residues.

34. The method of claim 25, whereby subsequent selective removal of exposed regions of the USG layers, undoped silicate glass, which form intermetal dielectric layers, IMD, is by a single or multi-step etch comprised of a reactive ion etch, RIE, with an etch chemistry selected from the group consisting of, one or more gases from the following: oxygen, nitrogen, hydrogen, chlorine substituted hydrocarbons, forming gas mixtures of nitrogen and hydrogen gas, fluorine substituted hydrocarbons, boron trichloride, argon and helium, stopping on an etch-stop layer.

35. The method of claim 25, whereby the excess copper, the diffusion barrier and the copper seed layer are removed from the surface and planarized by chemical mechanical polish, stopping on the chemical mechanical polish stop layer or buffer layer, with endpoint detection using IR reflectivity.

36. The method of claim 25, wherein the photoresist is comprised of top surface imaging photoresist, with an approximate thickness of 10,000 Angstroms and is exposed using ultraviolet light of 248 nm wavelength.

37. The method of claim 25, whereby the aluminum bond pads formed in the nitride, USG, nitride openings, and the aluminum bond pads are formed over and make electrical contact to some of the copper wiring lines, that make up the redistribution layer.

38. The method of claim 25, wherein the laser radiation, of wavelength 1,320 nm enters through the laser access window and using laser pulses, 0.3 milliJoules, pulse duration 20 milliseconds, ablation is performed on the delectable, copper via fuses, which are fusible links in the N-level close to the surface, to improve circuit performance and reliability.

* * * * *